United States Patent [19]

Babow

[11] Patent Number: 4,871,319
[45] Date of Patent: Oct. 3, 1989

[54] MOLDED CIRCUIT BOARD FOR RIBBON CABLE CONNECTOR

[75] Inventor: David A. Babow, Scottsdale, Ariz.
[73] Assignee: AMP Incorporated, Harrisburg, Pa.
[21] Appl. No.: 288,047
[22] Filed: Dec. 21, 1988
[51] Int. Cl.$^4$ ............................................. H01R 9/09
[52] U.S. Cl. ...................................... 439/77; 439/92; 439/493; 439/495
[58] Field of Search .................. 439/77, 92, 95, 96, 439/493, 495, 497–499

[56] References Cited

U.S. PATENT DOCUMENTS

| | | | |
|---|---|---|---|
| 3,042,591 | 7/1962 | Cado | 204/15 |
| 3,245,024 | 4/1966 | Evans | 339/17 |
| 3,629,185 | 12/1971 | Schneble, Jr. et al. | 260/40 |
| 3,678,385 | 7/1972 | Bruner | 339/17 CF |
| 3,689,865 | 9/1972 | Pierini et al. | 339/17 L |
| 3,904,261 | 9/1975 | Cooney | 439/494 |
| 3,907,621 | 9/1975 | Polichette et al. | 156/18 |
| 3,930,963 | 1/1976 | Polichette et al. | 204/15 |
| 3,993,802 | 11/1976 | Polichette et al. | 427/98 |
| 3,994,727 | 11/1976 | Polichette et al. | 427/98 |
| 4,094,566 | 6/1978 | Dola et al. | 339/14 R |
| 4,157,612 | 6/1979 | Rainal | 439/493 |
| 4,160,573 | 7/1979 | Weisenburger | 339/176 MF |
| 4,269,466 | 5/1981 | Huber | 339/176 MF |
| 4,287,253 | 9/1981 | Leech | 428/323 |
| 4,349,944 | 9/1982 | Fickes | 29/566.4 |
| 4,367,909 | 1/1983 | Shatto, Jr. et al. | 339/176 MF |
| 4,511,597 | 4/1985 | Teng et al. | 427/417 |
| 4,532,152 | 7/1985 | Elarde | 427/98 |
| 4,579,404 | 4/1986 | Lockard | 339/14 R |
| 4,594,311 | 6/1986 | Frisch et al. | 430/315 |
| 4,602,830 | 7/1986 | Lockard | 339/14 R |
| 4,602,831 | 7/1986 | Lockard | 339/14 R |
| 4,604,799 | 8/1986 | Gurol | 29/897 |
| 4,679,868 | 7/1987 | Hasircoglu | 439/495 |
| 4,682,828 | 7/1987 | Piper et al. | 439/92 |
| 4,736,275 | 4/1988 | Kendall et al. | 361/403 |
| 4,753,005 | 6/1988 | Hasircoglu | 439/77 |
| 4,770,645 | 9/1988 | Antes | 439/493 |
| 4,776,806 | 10/1988 | Adams | 439/77 |
| 4,796,358 | 1/1989 | Long, Jr. et al. | 29/863 |

FOREIGN PATENT DOCUMENTS 0192233 2/1986 European Pat. Off. .

OTHER PUBLICATIONS

Raychem Instruction Sheet No. H53026, "Solder-Quik TM Tapes for Fine-Pitch Surface Mounting", Sep., 1987; Raychem Corporation, Menlo Park, Calif.
Photograph of Sample, "Raychem SolderQuik TM Device DSQ-42 47 Windows @0.025-Inch Pitch"; Raychem Corporation, Menlo Park, Calif.

Primary Examiner—P. Austin Bradley
Attorney, Agent, or Firm—Anton P. Ness

[57] ABSTRACT

A paddle board for a connector for one or two ribbon cables having closely spaced signal and ground wires, includes on one or both major surfaces a plurality of wire-terminating pads comprising conductive material along bottoms of wire-receiving grooves proximate the cable-proximate edge of the board, the grooves defined by serrate ridges. Circuit paths extend from the signal ones of the wire-terminating pads to terminal-connecting pads along one or both major surfaces at a connector-proximate edge of the board to be connected to signal terminals of the connector. Other circuit paths extend from ground ones of the wire-terminating pads to a ground bus which includes at least one ground circuit path extending to a ground terminal-connecting pad along the connector-proximate edge. The wires of each ribbon cable are soldered to the wire-terminating pads after being wiped into the grooves, and the ridges serve as integral wire alignment means. The paddle board is molded of plastic and then plated to define the pads and circuit paths, and can include molded through-holes which become plated, and can also easily have a shape molded to include other structural features such as cable-receiving recesses as desired. A solder strip can be placed transversely across the row of wire ends and melted by a transverse hot bar, with interruptions in the ridges defining a strip- and bar-receiving region.

11 Claims, 11 Drawing Sheets

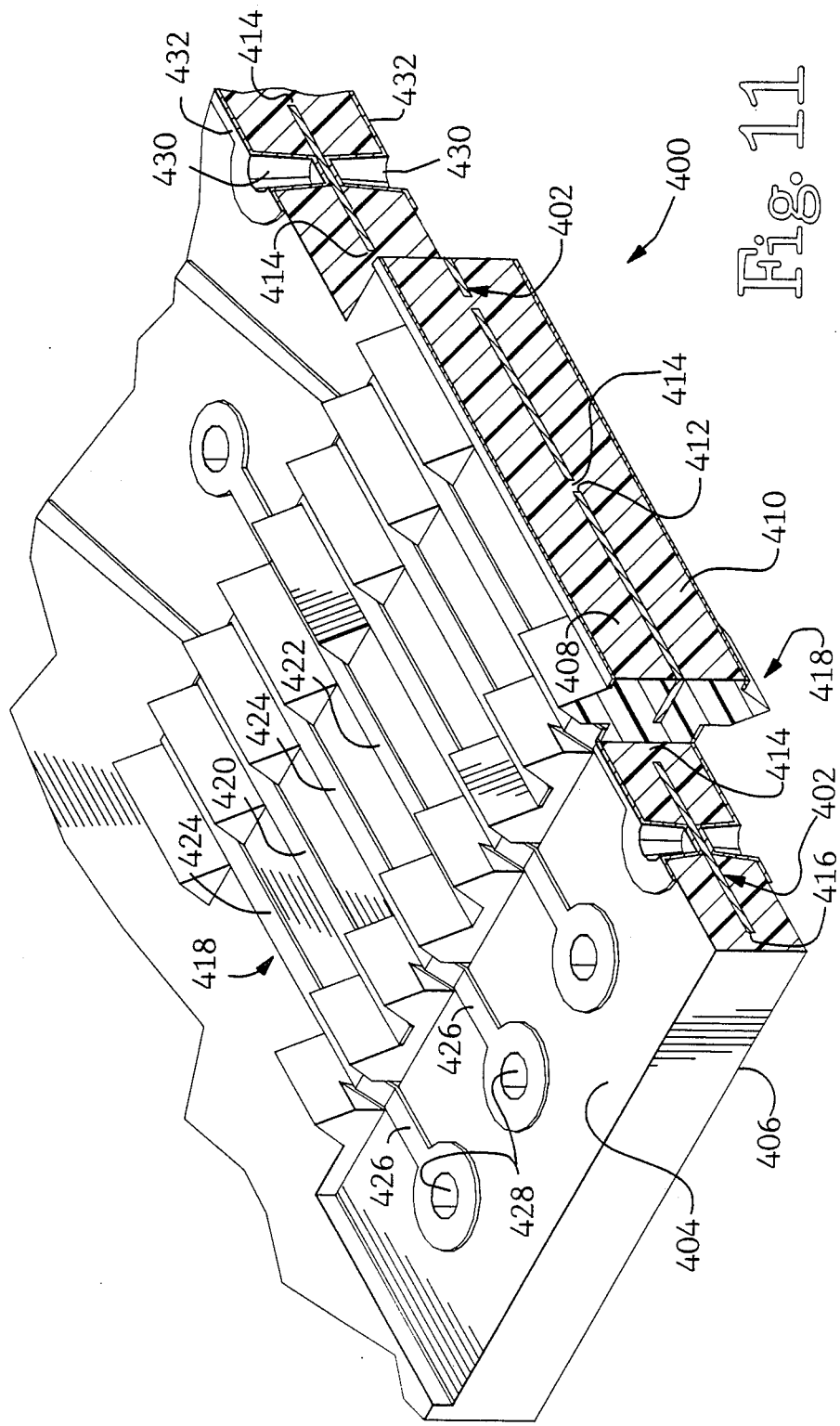

MOLDED CIRCUIT BOARD FOR RIBBON CABLE CONNECTOR

FIELD OF THE INVENTION

The present invention relates to the field of electrical connectors and more particularly to connectors for multiconductor high density ribbon cable for signal transmission.

BACKGROUND OF THE INVENTION

Electrical connectors are known for terminating high density ribbon cable having a plurality of closely spaced small diameter round conductor wires for signal transmission, with signal conductor wires alternating across the cable with corresponding ground conductor wires. Such connectors include a plurality of terminals equal to the number of signal conductors and at least one and usually more than one terminal for the ground conductor wires which are disposed between the signal wires of the cable and are commoned within the connector. However, the connector terminals are much larger in cross-sectional dimension than the signal wires, and are disposed in the connector with dielectric material therebetween, so that the terminals are required to be spaced apart on different centerline spacing than the spacing of the conductor wires in the cable; the terminals are also commonly disposed in two rows in the connector.

In such connectors a transition adapter, sometimes termed a paddle board, is used to interconnect the cable's conductor wires with respective termination sections of the connector terminals, with the transition adapter including circuit paths which have wire-proximate ends spaced to correspond with the wire spacing and terminal-proximate ends spaced to correspond with the terminal spacing. A transition adapter for a two-row connector also provides for circuit paths to extend to upper and lower surfaces for connection with the two rows of terminals. Such a transition adapter has heretofore been a conventional printed circuit board having etched circuit paths thereon. An example of a connector utilizing such a transition adapter is disclosed in U. S. Pat. No. 4,679,868. Another example of a connector for termination to a plurality of ribbon cables using a single printed circuit board is disclosed in U. S. Pat. No. 4,682,828. With printed circuit boards the circuit paths are flat conductive surfaces to which the wire ends of the conductor wires must be soldered. For assuring that the wire ends are terminated to the appropriate circuit paths, the closely spaced small diameter wire ends must be held spaced apart and appropriately located such as by alignment tooling until soldering has been performed.

It is desired to provide a transition adapter which facilitates the accurate placement of the closely spaced small diameter conductor wires of a ribbon cable prior to soldering thereof to respective circuit pads of the adapter.

SUMMARY OF THE INVENTION

The present invention provides a transition adapter which includes a substrate molded of dielectric material to which circuit paths have been plated, the circuit paths having wire-proximate ends or pads near a cable-proximate edge and terminal-proximate ends or pads along a connector-proximate edge. The wire-proximate pads are arrayed along a first major substrate surface spaced closely together corresponding to the spacing of the conductor wires of the ribbon cable with which the transition adapter is to be used. The terminal-proximate pads are arrayed along the first major substrate surface or along both the first and opposed second major surfaces of the substrate in a spacing corresponding to the spacing of the terminals of the connector with which the transition adapter is to be used. Plated through-holes are used to extend from the first major surface to the second major surface, for those circuit paths extending to terminal-proximate pads on the second major surface, connecting circuit path segments on the respective surfaces.

The wire-proximate pads are disposed within and along the bottoms of respective grooves molded into the first major surface of the substrate, with the grooves defined by and separated by serrate ridges so that the respective wire ends are urged into proper locations along the groove bottoms by the ridges as the wire ends extending from an insulated portion of the ribbon cable are wiped along the first major surface extending a short distance inwardly from the cable-proximate edge. The substrate may also be molded to include a recess along the cable-proximate edge wherein the end of the insulated length of the cable may be disposed, with the wire-receiving grooves being located forwardly of the recess. Soldering may be performed by applying and melting individual solder amounts along each wire end or by melting individual solder amounts previously disposed along the respective groove bottoms atop the wire-proximate pads.

For convenience and ease of manufacture and assembly however, a continuous strip of solder may be placed across the array of wire ends and then reflowed, in a process known to be used with prior art printed circuit board transition adapters. The solder will seek to flow by capillary action around the individual wire ends and not form short circuits if the solder strip is thin enough. Another form of solder strip is known in which individual transverse strips of solder are arrayed along an adhesive-coated surface of a thin strip of dielectric tape such as MYLAR plastic (trademark of E. I. DuPont de Nemours and Co.), the individual strips being spaced to correspond with the centerline spacing of the ribbon cable conductor wires. In one embodiment of the present invention the wire ends extend beyond the inward ends of the grooves so that a soldering bar can be placed across the array of wire ends to melt the solder. In another embodiment the soldering location is established intermediate the lengths of the grooves, and the serrate ridges are interrupted by a flat region extending transversely across the first major substrate surface, the flat region having a width just larger than the width of the solder strip and soldering bar. In yet another embodiment the serrate ridges are interrupted by respective transversely aligned low-height lands having a height about half the diameter of the conductor wires of the ribbon cable, again having a width just larger than the width of the solder strip and soldering bar.

Circuit paths for the ground conductors may be be commoned by a transverse ground bus which includes one or more circuit path segments extending forwardly to the connector-proximate edge for termination to one or more ground terminals as desired. The ground bus may be a plated surface portion connected to the wire-proximate pads for the ground wires and disposed at the cable-proximate substrate edge along the first major surface rearwardly of the stripped wire ends and adjacent cable insulation, with plated through-holes connecting the ground bus with a corresponding ground bus along the second major surface forwardly from which extend the circuit paths to the ground terminals.

Where the ground bus is a buried circuit, the adapter may have wire-receiving grooves on both major surfaces for termination to a pair of ribbon cables.

It is an objective of the present invention to provide a transition adapter having integral wire locating means to assure appropriate placement of the wire ends prior to soldering, without wire-locating tooling.

Embodiments of the present invention will now be discussed with reference to the accompanying drawings.

BRIEF DESCRIPTION OF THE DRAWINGS

FIG. 11 illustrates a fifth embodiment including a ground plane molded within the substrate, and adapted to be terminated to a pair of ribbon cables.

DETAILED DESCRIPTION OF THE PREFERRED EMBODIMENTS

Figure 1:
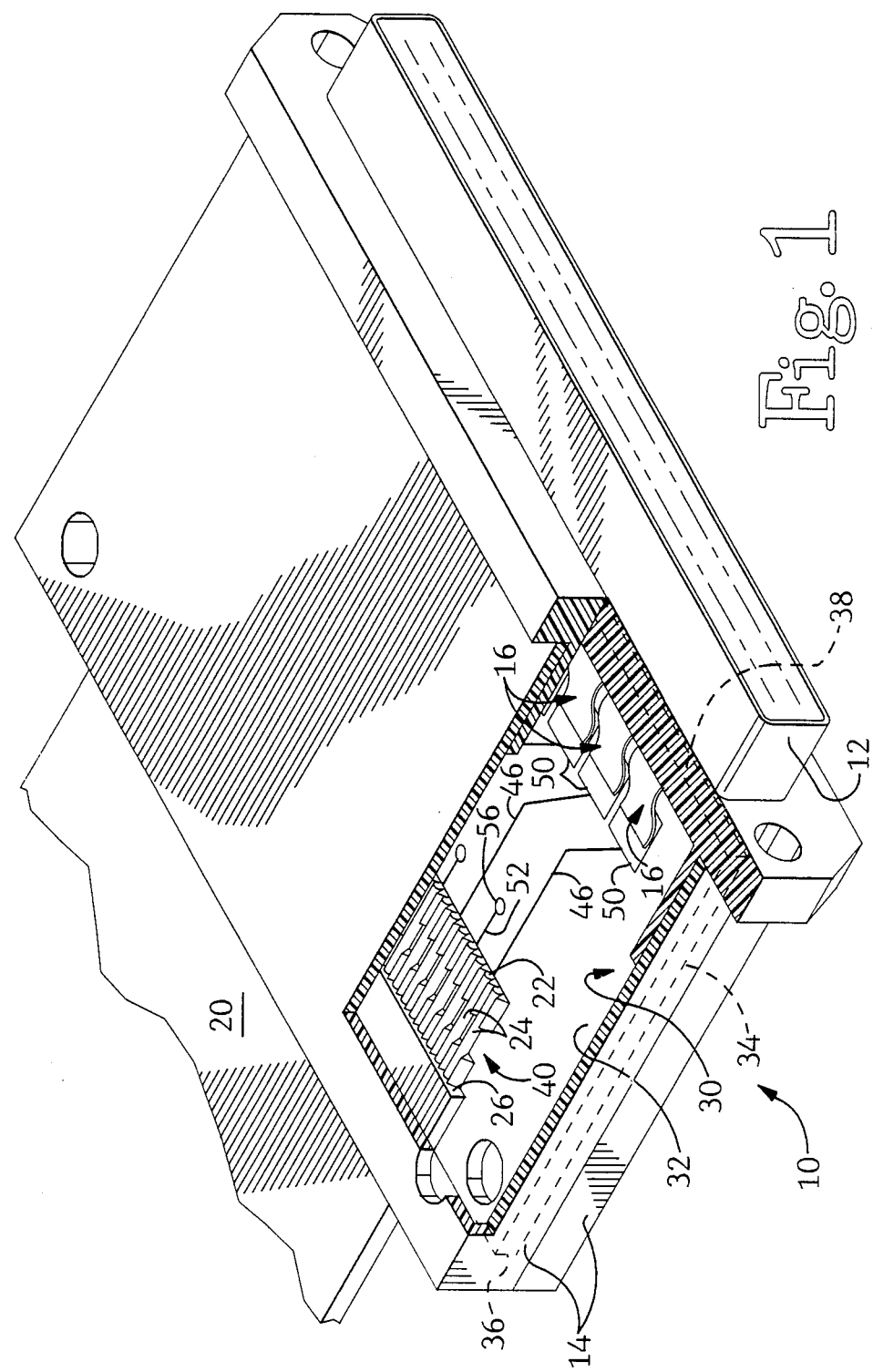
FIG. 1 is a perspective view of a connector and ribbon cable with which the adapter of the present invention is used, with a portion of the cover broken away.

In FIG. 1 a connector assembly 10 has a housing 12 and covers 14 fastened thereto, with housing 12 containing two rows of terminals 16 to which respective conductor wires 22,24 of flat ribbon cable 20 are to be connected. Transition adapter 30 is secured to connector 10 and includes circuit paths connecting respective conductors 22,24 of cable 20 to the terminals 16. Adapter 30 comprises a dielectric substrate which includes a first major surface 32, an opposed second major surface 34, a cable-proximate edge 36 and an opposed connector-proximate edge 38. Flat ribbon cable 20 is of the type having alternating signal 22 and ground 24 conductor wires embedded within insulation 26 and having wire diameters of for example 0.010 inches and which are spaced for example with their respective centerlines 0.025 inches apart. Connector 10 is of the type having its terminals 16 of each row disposed in respective passageways spaced 0.050 or 0.100 inches apart laterally, with the two rows also being 0.050 or 0.100 inches apart from each other.

Figure 2:
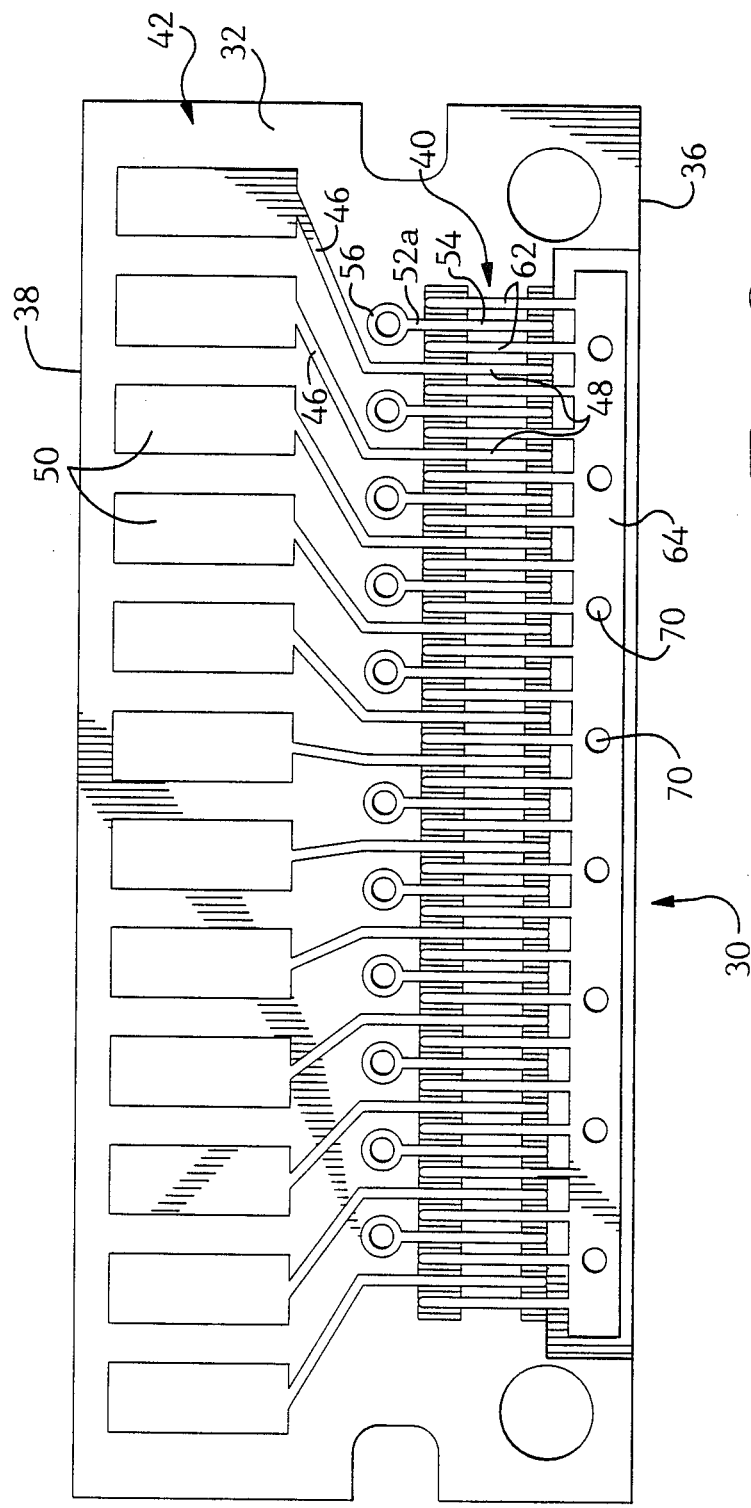
FIGS. 2 and 3 are plan views of the first and second major surfaces of the adapter showing the circuit paths plated thereon.
Figure 3:
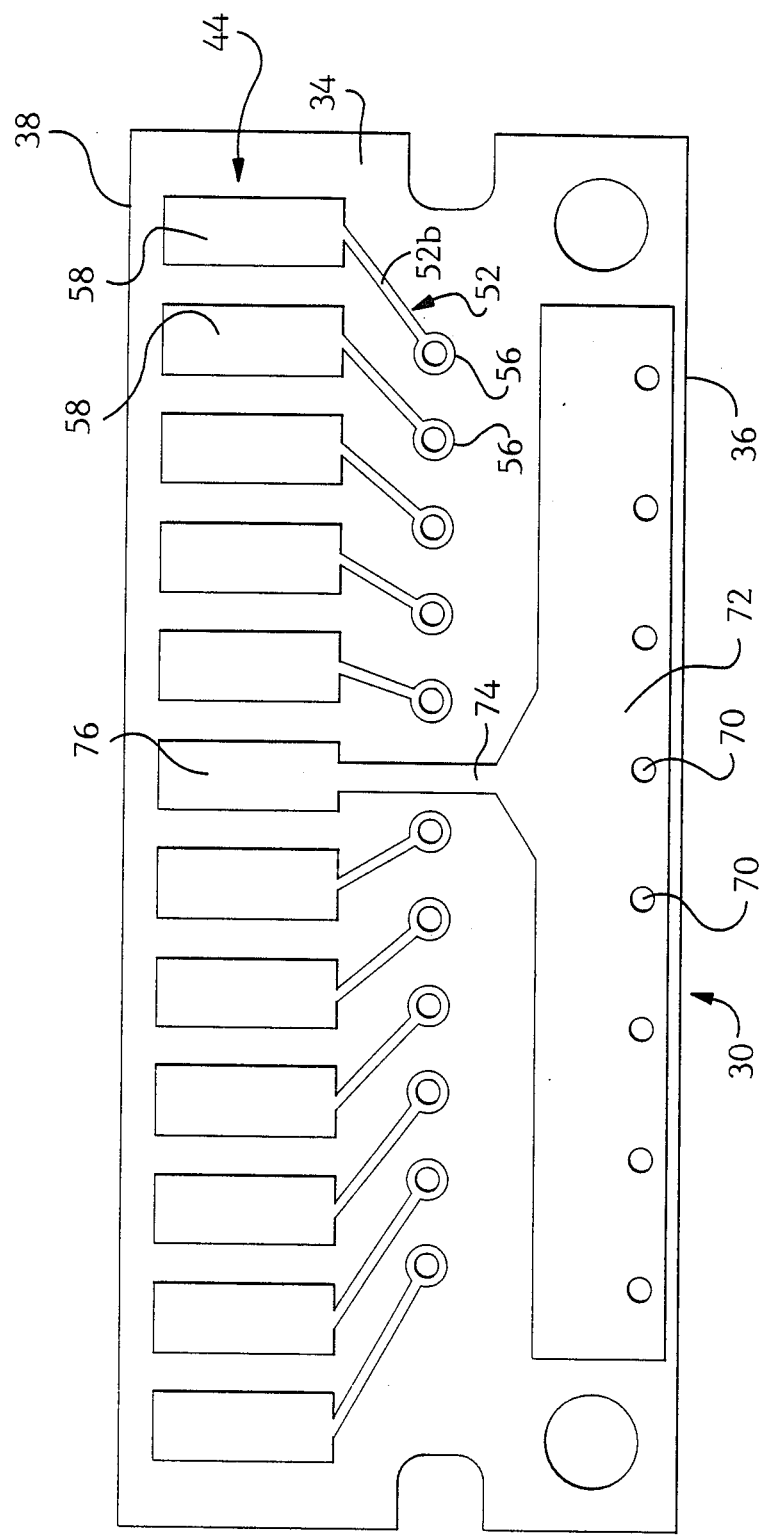
Figure 4:
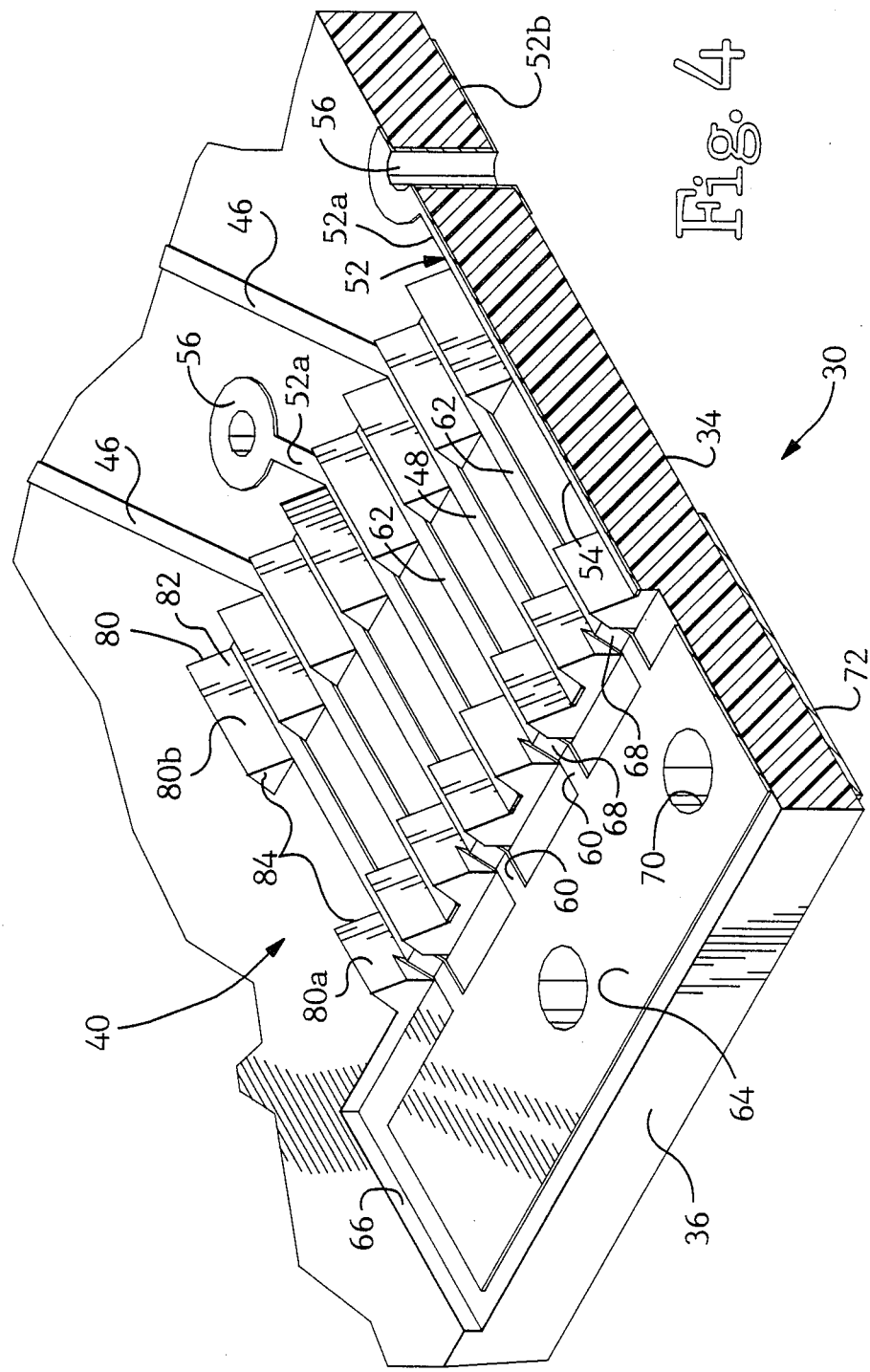
FIG. 4 is an enlarged perspective view of a portion of the wire-terminating region of a first embodiment of adapter showing the array of grooves and ridges.

In FIGS. 2 to 4, transition adapter 30 includes circuit paths which extend from a wire-terminating region 40 along the cable-proximate edge 36 to first and second terminal-connecting regions 42,44 at connector-proximate edge 38, with region 42 disposed along first major surface 32 and region 44 disposed along second major surface 34. First signal circuit paths 46 extend from pads 48 in wire-terminating region 40, entirely along first major surface 32 to conclude at terminal-connecting pads 50 in first terminal-connecting region 42. Second signal circuit paths 52 consist of segments 52a which extend along first major surface 32 from pads 54 in wire-terminating region 40 to plated through-holes 56 which extend to second major surface 34, and segments 52b which extend along second major surface 34 to conclude at terminal-connecting pads 58. Ground circuit paths 60 extend from pads 62 rearwardly to ground bus 64 along first major surface 32, which will be isolated from the exposed wire ends by placing the end of the insulated cable portion forwardly thereof. Preferably the end of the insulated cable portion will be disposed within a recess 66 having a depth equal to the thickness of the insulation along a major surface of the cable, so that the stripped wire ends will extend forwardly at the level of first major surface 32 of substrate 30. Ground circuit paths 60 preferably extend into recess 66 along tapered portions 68 which facilitates adhesion of plating material at corner edges of the substrate. Ground bus 64 is connected by plated through-holes 70 to a ground bus 72 along second major surface 34. Ground path 74 extends forwardly along second major surface 34 from ground bus 72 to conclude in terminal-connecting pad 76 in second terminal-connecting region 44, to be connected to a ground terminal in connector 10. Ground path 74 and ground pad 76 could be located at a different location if desired, and more than one ground path 74 and ground pad 76 could easily be utilized in the same manner to extend to any desired ground terminal locations.

The transition adapter of the present invention as seen in FIG. 4 includes a wire-terminating region 40 characterized by an array of closely spaced serrate ridges 80 defining axially extending wire-receiving grooves 82 therebetween within which are disposed elongate wire-terminating pads 48,54,62. Grooves 82 and pads 48,54,62 are spaced along wire-terminating region 40 matching the spacing of signal and ground conductors of the cable with which the particular transition adapter is intended. Each serrate ridge 80 preferably is formed to have rearward and forward ridge portions 80a,80b separated by an interruption 84, with interruptions 84 aligned transversely across wire-terminating region 40.

Figure 5:
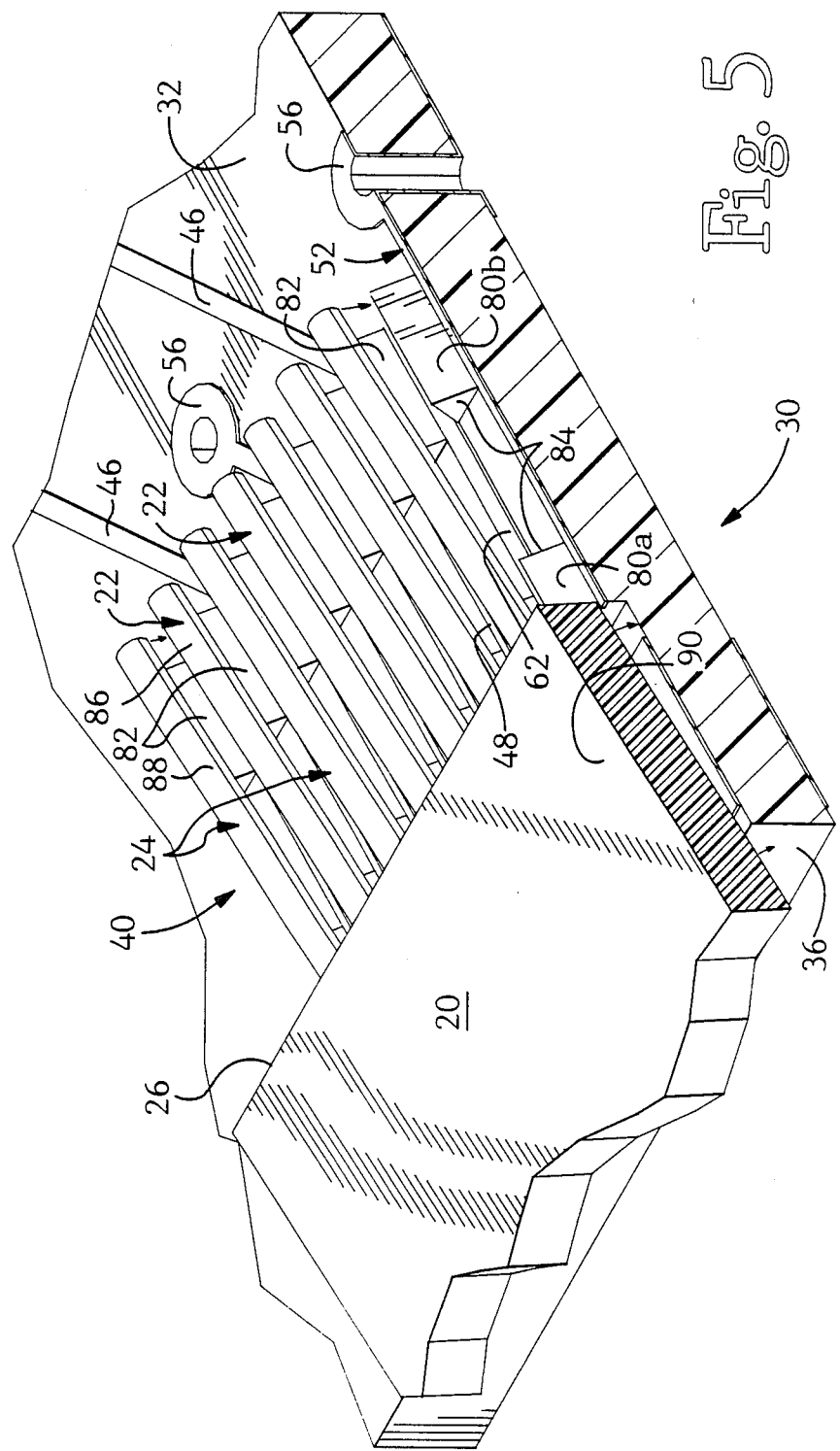
FIGS. 5 to 7 are enlarged perspective views of several grooves and ridges of FIG. 4, with wires being wiped thereinto, a solder strip being placed thereover and a hot bar for melting the solder placed thereover, and the resulting wire terminations, respectively.

As seen in FIG. 5, cable 20 has been prepared by a portion of insulation 26 being removed so that stripped wire ends 86,88 of signal and ground conductor wires 22,24 extend forwardly from insulated portion 90 of ribbon cable 20, and the prepared cable end is positioned above and along wire-terminating region 40. Stripped wire ends 86,88 are wiped along wire-terminating region 40 into grooves 82 and are precisely located and aligned with pads 48,54,62 by ridge portions 80a,80b without the use of special alignment tooling.

Figure 6:
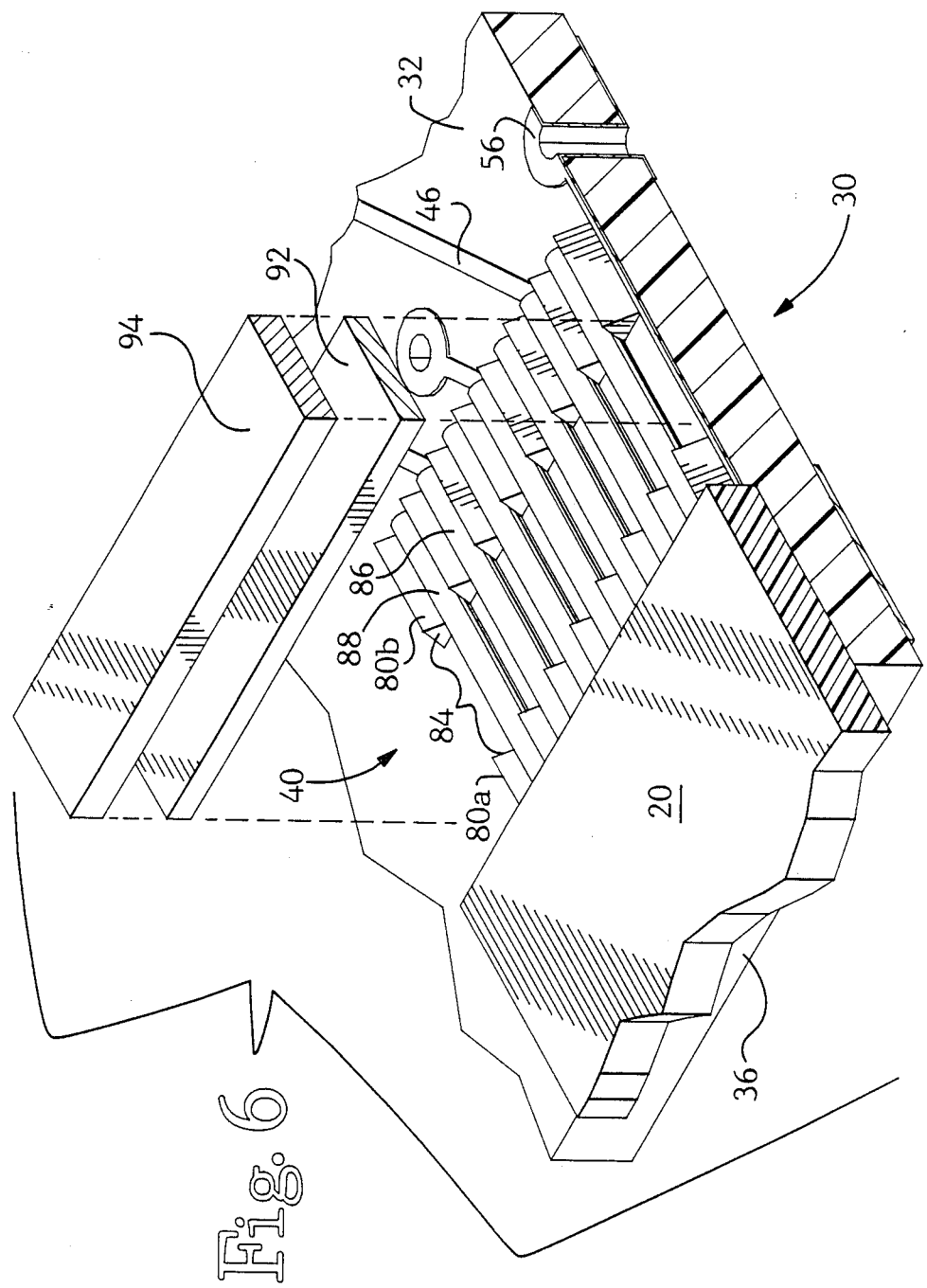
Figure 7:
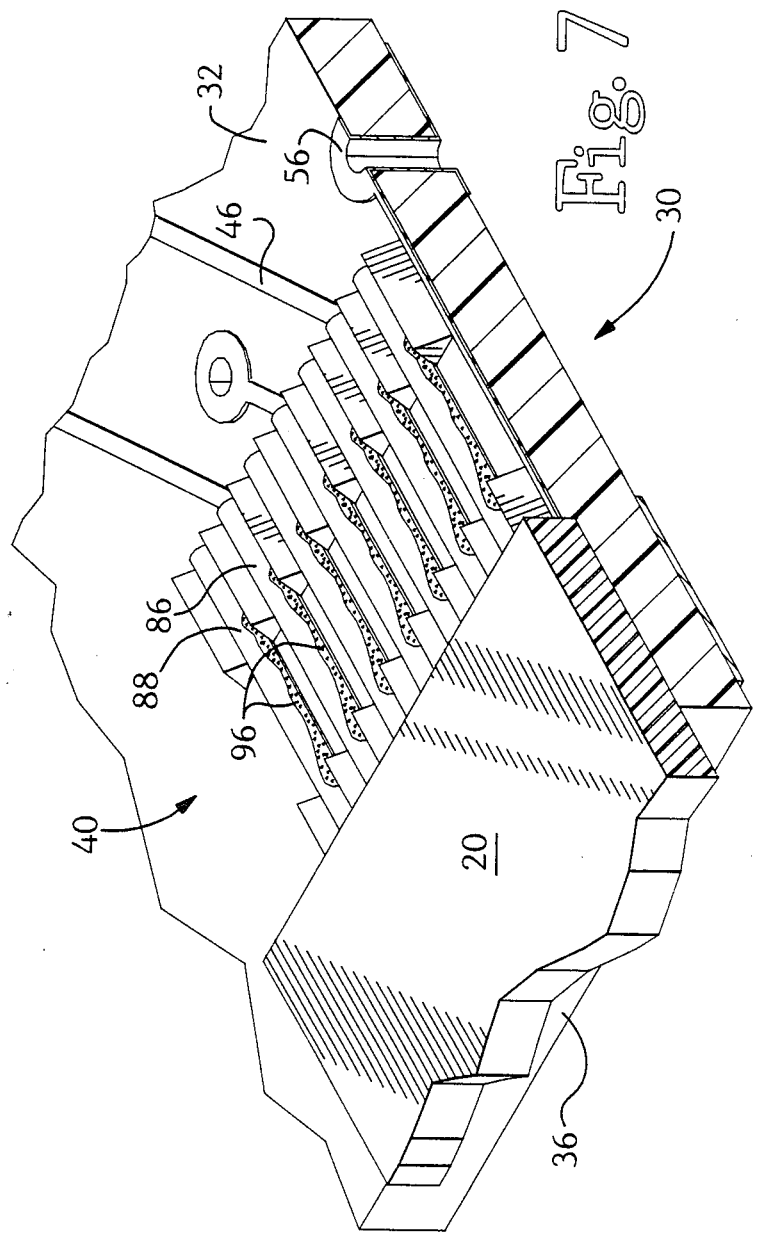
Figure 8:
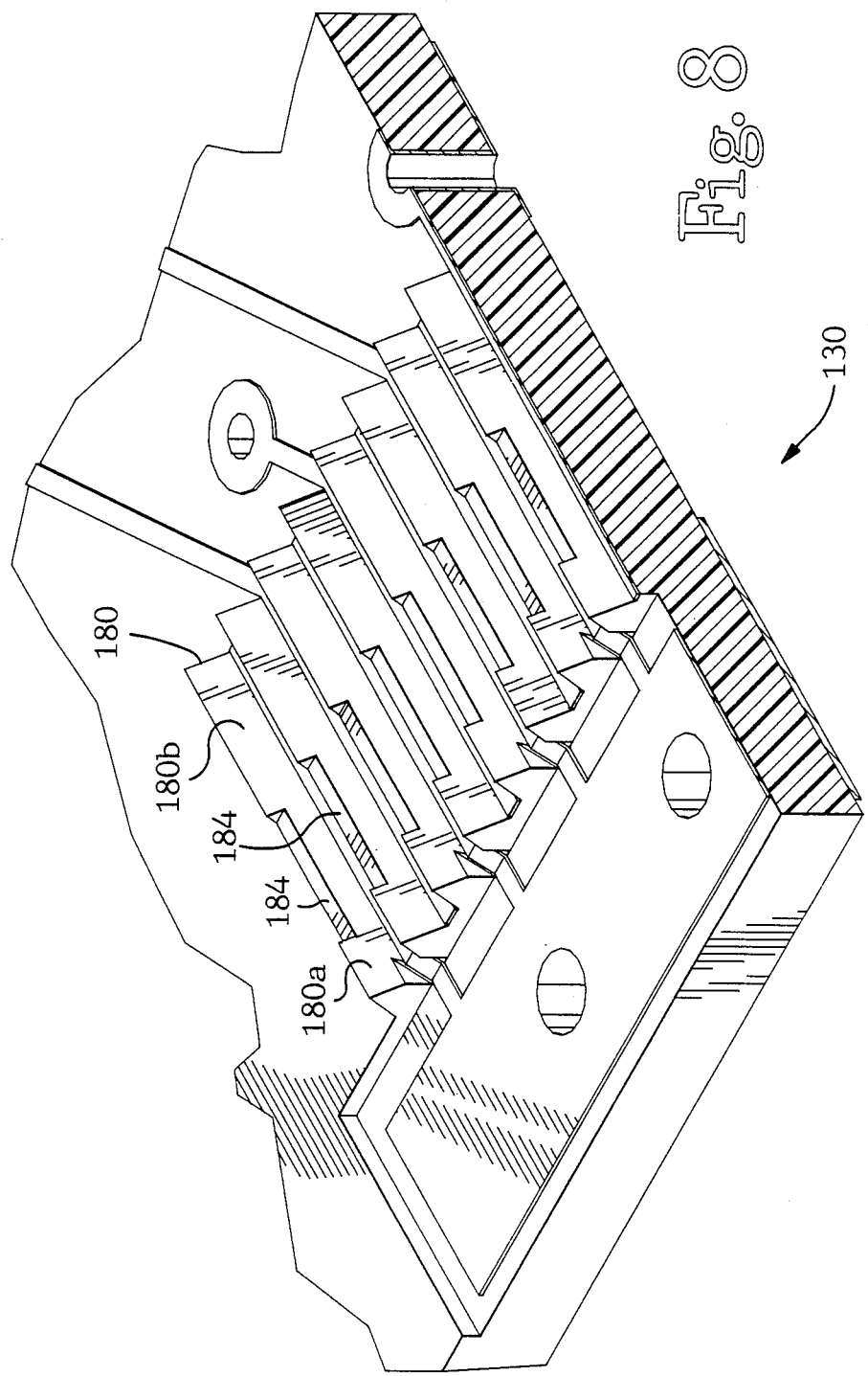
FIG. 8 illustrates a second embodiment similar to the first embodiment, with low height ridge interruptions.

In FIG. 6 a strip of solder 92 is placed transversely across the array of wire ends 86,88 spanning interruptions 84. A soldering bar 94 is brought into position against solder strip 92 and is heated to melt the solder material of strip 92. Upon melting the solder material flows around and along stripped wire ends 86,88 and along pads 48,54,62 at the bottom of grooves 82, following the metal surfaces of the pads and the wires. As shown in FIG. 8, upon cooling the solder material joins the wire ends 86,88 to respective pads 48,54,62 at discrete joints 96. Fabrication of such solder strips is known whereby the thickness is controlled to just provide sufficient solder for forming discrete joints 96 without excess solder remaining between pads and wire ends which would undesirably bridge the circuits. Thus interruptions 84 allow for solder strip 92 and soldering bar 94 to be laid directly across the top surfaces of the array of wire ends 86,88.

FIG. 8 illustrates a second embodiment of transition adapter 130 in which interruptions 184 are low-height ridge segments between rearward and forward ridge segments 180a,180b which would not interfere with placement of the solder strip or soldering bar while providing some physical structure between adjacent wire-terminating pads. This embodiment may be useful with a solder strip having an array of individual solder strips positioned to correspond with the spacing of the wires.

Figure 9:
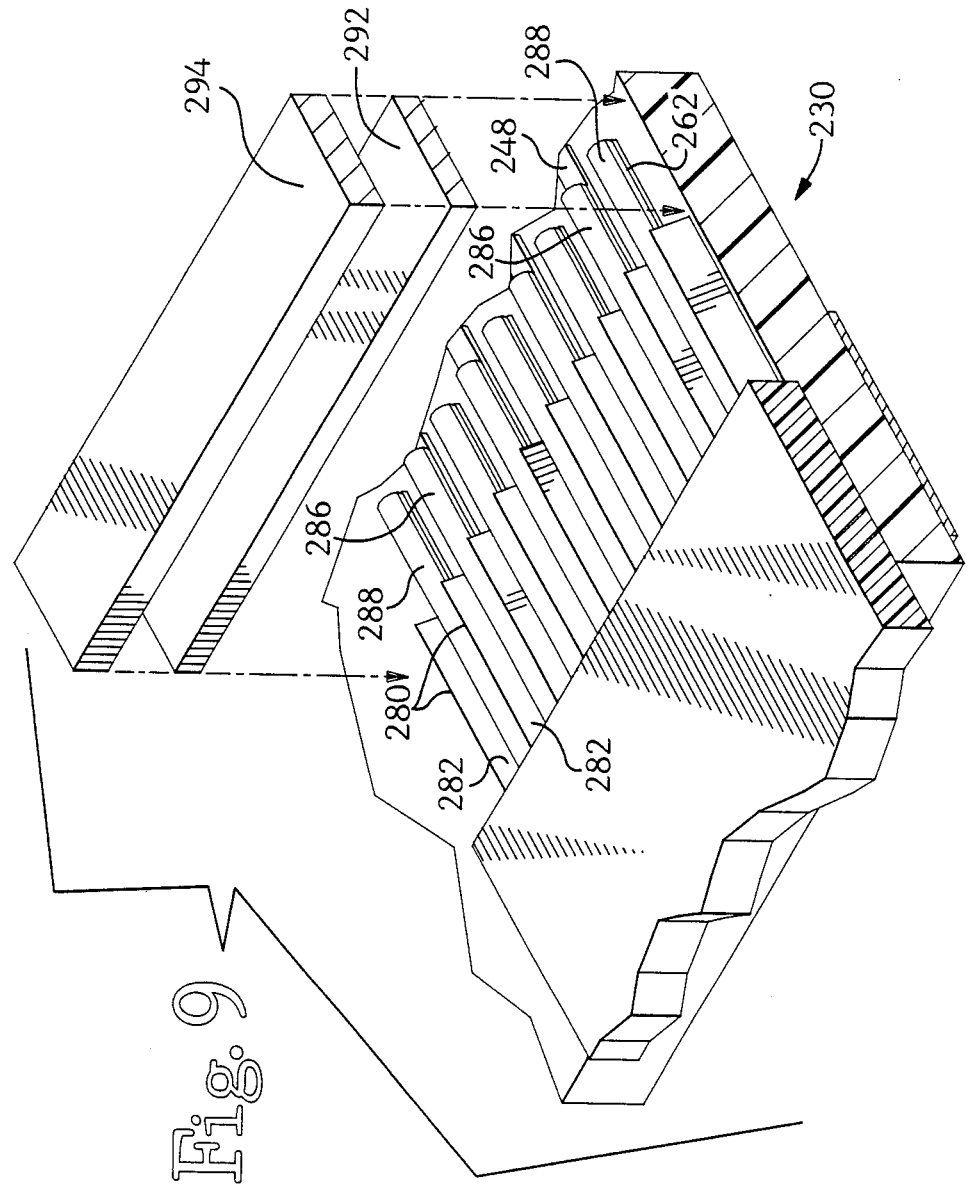
FIG. 9 illustrates a third embodiment of adapter for soldering the wire ends forwardly of the grooves.

FIG. 9 illustrates a third embodiment of transition adapter 230 in which the wire ends 286,288 are extended forwardly of the forward ends of ridges 280. Wire-terminating pads 248,262 extend forwardly of grooves 282. Solder strip 292 and soldering bar 294 may conveniently be placed thereacross against the top surfaces of the wire ends.

Figure 10:
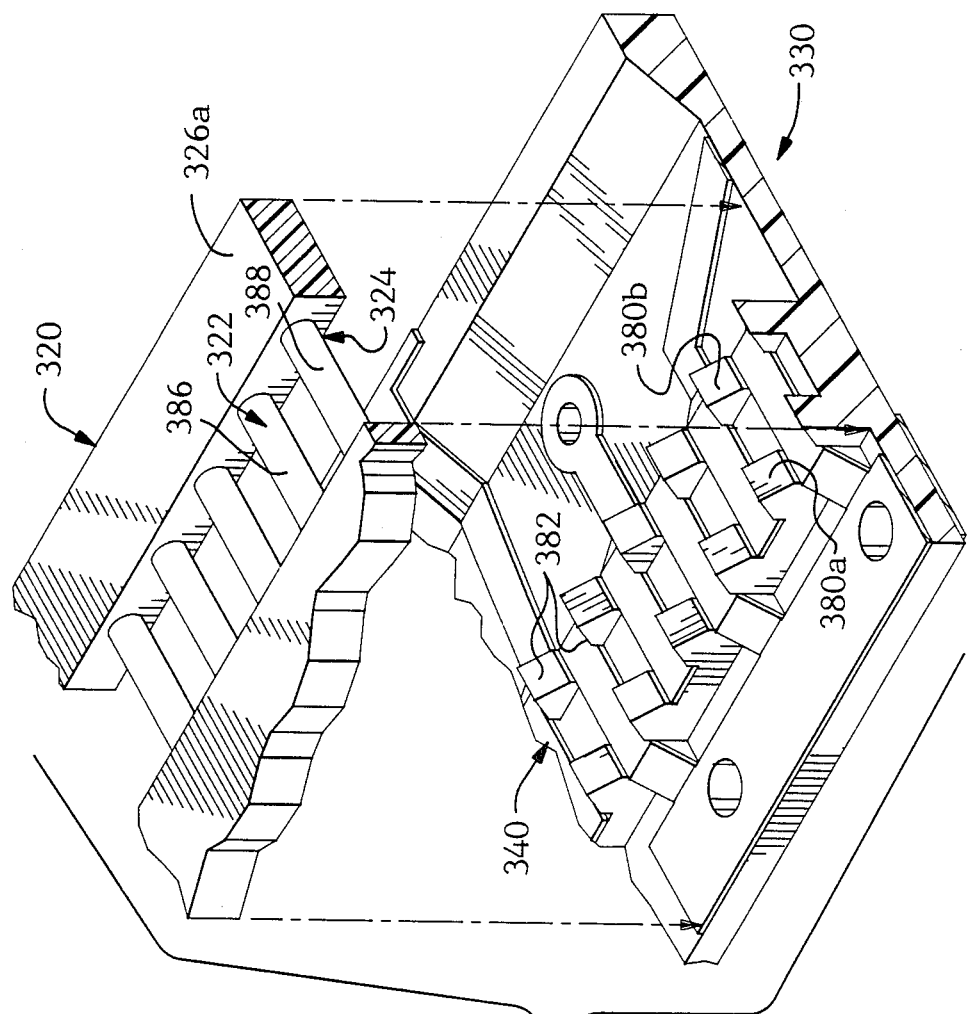
FIG. 10 illustrates a fourth embodiment with the substrate having a thinner cable-receiving portion which includes the wire-receiving grooves.

In FIG. 10, fourth embodiment of transition adapter 330 is a molded substrate having a decreased thickness rearwardly from the connector-proximate edge, with wire-terminating region 340 being raised. The end portion of cable 320 is prepared with a short portion 326a of the end of the insulative jacket being moved forwardly to the ends of stripped wire ends 386,388 exposing portions of conductor wires 322,324 for termination while keeping the wire ends properly aligned and spaced apart. Axially short rearward and forward ridge portions 380a,380b project upwardly within the insulation gap rearward of insulation portion 326a, receiving conductor wires 322,324 within grooves 382 for termination, with the plated groove bottoms being raised a slight amount equaling the insulation thickness for the bottom surfaces of wires 322,324 to engage the respective wire-proximate pads.

FIG. 11 illustrates a fifth embodiment of transition adapter 400, wherein a ground plane 402 has been embedded within the substrate during molding, intermediate first and second major surfaces 404,406 of first and second plastic layers 408,410. This arrangement is set forth in greater particularity in U.S. patent application Ser. No. 07/287764 filed 12/21/88 (concurrently herewith). Such a buried ground plane permits the use of the present invention for terminating two ribbon cables on opposing major surfaces of a paddle board, with the signal conductors of each cable corresponding to signal terminals of the connector located along the same major surface and ground terminals at one or more terminal locations of either or both major surfaces of the paddle board. Ground plane 402 includes a plurality of holes 412 through which extend column joints 414 of plastic material joining the otherwise separated plastic layers 408,410 at a plurality of locations, and plastic material may also extend about the periphery 416 of ground plane 402 also joining layers 404,406. Adapter 400 is capable of receiving a pair of ribbon cables at opposing wire-termination regions 418 on opposing major surfaces 404,406.

At wire-terminating region 418 containing wire-terminating pads 420,422,424 ground path segments 426 extend rearwardly from wire-terminating pads 424 to plated via holes 428 which extend into first and second plastic layers 408,410 to reach embedded ground plane 402. First and second major surfaces 404,406 forwardly of wire-terminating regions 418 are dedicated to circuit paths for signal transmission of signals from respective cables terminated to adapter 400 at respective ones of wire-terminating regions 418. A terminal-connecting pad (not shown) along one or both major surfaces is used for connecting to a ground terminal, and ground plane 402 is connected thereto by a plated via hole 430 similar to via holes 428 and a ground path segment 432. Preferably the side walls of the plated via holes are slightly tapered facilitating molding thereof and plating thereof. It is also preferable that a pair of column joints 414 be disposed on opposite sides of each plated via hole to assure against possible slight delamination at the plated via holes of the portions of first or second plastic layers 408,410 respectively from ground plane 402, which slight delamination could possibly crack or fracture the plating material of the plated via holes.

Transition adapter 30 of the present invention is molded of a dielectric plastic resin material and the circuit paths, terminal-connecting and wire-terminating pads, through-holes and ground buses are plated thereto such as by known electroless plating techniques or by electroless/electroplating techniques. Electroless plating techniques are disclosed in U.S. Pat. Nos. 3,629,185; 3,907,621; 3,930,963; 3,993,802; 3,994,727; 4,287,253; 4,511,597; and 4,594,311 and European Patent Application No. 861020550 owned by Kollmorgen Corporation. A combination of electroless/electroplating is disclosed in U.S. Pat. No. 3,042,591. Another method is disclosed in U.S. Pat. Nos. 4,532,152 or 4,604,799.

Preferably a technique is followed of molding a plastic member such as for example of glass-filled polyethersulfone resin sold under the trade designation VICTREX by ICI Americas, Wilmington, Del., or such as ULTEM polyetherimide resin sold by General Electric Company, Pittsfield, Mass. All exposed surface portions are then treated for adhesion promotion and are coated with an ultraviolet light sensitive catalyst as described in U.S. Pat. No. 4,511,597. A masking means opaque to ultraviolet light is then placed over all surfaces of the molded plastic member which are intended to remain nonconductive. All unmasked surfaces of the catalyzed and masked plastic member including through-holes are exposed to ultraviolet light of appropriate actinic wavelength and energy level to activate the catalyst on the exposed surface areas to render the catalyzed areas receptive to plating of a metal layer thereonto. The masking means is then removed. The catalyst-activated areas are plated such as by electroless plating, or electroplating or a combination thereof, with a first layer of copper about 0.0014 inches thick. A second layer of tin about 0.0002 inches thick is then plated onto the first layer. The plated adapter substrate thus formed may then be subjected to baking or other post-curing restoration steps and cleaning steps if desired.

Alternatively, the adhesion-promoted plastic member may be selectively coated with plating resist by conventional means, and the exposed areas then electrolessly plated with commercially available plating chemistry. The resist is then removed such as with solvent. Baking or other post-curing restoration steps and cleaning steps may then optionally be utilized.

The plastic substrate is thus easily molded to have through-holes, grooves and serrate ridges such as ridges 80 as in FIG. 4 or ridges 180 as in FIG. 8. Such a molded substrate could also include a ground plane embedded therein, as seen in FIG. 11. The substrate may also easily have other various integral structural features such as fastener receiving holes, cable-receiving recess 66 of FIG. 4, or two regions of differing thickness as in FIG. 10.

Other modifications and variations can be devised by skilled artisans which are within the spirit of the invention and the scope of the claims.

What is claimed is:

1. A transition adapter having circuit paths thereon for providing an electrical connection transition between ends of closely spaced conductors of at least one ribbon cable and respective terminals spaced more widely apart in at least one plane, for an electrical connector terminating the at least one ribbon cable, comprising:

a molded substrate having first and second major surfaces extending from a cable-proximate edge to a connector-proximate edge, said substrate having on at least one of said first and second major surfaces a wire-terminating region proximate said cable-proximate edge including wire-terminating pads corresponding to said conductors of said at least one cable and spaced to correspond to the centerline spacing of said conductors in said cable, said substrate further including on at least one of said first and second major surfaces a terminal-connecting region proximate said connector-proximate edge including terminal-connecting pads therealong corresponding to said terminals of a connector, and said substrate further including circuit paths electrically connecting associated wire-terminating pads and terminal-connecting pads, with said circuit paths, said wire-terminating pads and said terminal-connecting pads being plated on said substrate; and said substrate having serrate ridges included in each said wire-terminating region separating adjacent ones of said wire-terminating pads, defining wire-receiving grooves therebetween with respective said wire-terminating pads along bottoms thereof, whereby when a said cable is placed adjacent said substrate with exposed conductor wire ends above a respective said wire-terminating region, said wire ends are appropriately located and aligned by said ridges within respective grooves upon being wiped thereinto without alignment tooling, for solder termination to respective said wire-termination pads along said groove bottoms.

2. A transition adapter as set forth in claim 1 wherein said substrate includes two wire-receiving regions to which respective ones of a pair of cables are terminated.

3. A transition adapter as set forth in claim 1 wherein said substrate includes formed therein along said cable-proximate edge rearwardly of said wire-terminating region, a cable-receiving recess having a depth about equal to insulation thickness along a major surface of said cable.

4. A transition adapter as set forth in claim 1 wherein a rearward portion of said substrate surrounding said wire-terminating region is thinner than a forward portion including said terminal-connecting region, with said groove bottoms having a raised height above said first major surface of said rearward portion about equal to insulation thickness along a major surface of said cable, whereby when said cable end is placed against said said first major surface of said rearward substrate portion said wire ends just engage said wire-terminating pads along said groove bottoms prior to solder termination.

5. A transition adapter as set forth in claim 1 wherein said ridges have respective interruptions intermediate ends thereof, said interruptions together defining a transverse solder-receiving area so that upon receipt of said wire ends along said grooves a strip of solder is placeable transversely across top surfaces of said conductor wire ends whereafter said solder strip is meltable terminating said wire ends to respective said wire-terminating pads.

6. A transition adapter as set forth in claim 5 wherein said interruptions comprise low-height ridge segments between rearward and forward ridge segments.

7. A transition adapter as set forth in claim 1 wherein said substrate includes ground circuit path segments extending from ground ones of said wire-terminating pads to a ground bus means, and further includes at least one ground circuit path extending from said ground bus means to a ground one of said terminal-connecting pads.

8. A transition adapter as set forth in claim 7 wherein said ground bus means includes a first portion disposed on said first major surface isolated from stripped conductor portions upon cable assembly, said first portion being connected to said ground circuit path segments, and a second portion disposed on said second major surface connected to said at least one ground circuit path extending to said ground one of said terminal-connecting pads, said first and second ground bus portions interconnected by plated through-holes.

9. A transition adapter as set forth in claim 1 for a signal transmission ribbon cable wherein ones of said conductor wires are signal wires to be terminated to respective signal pads in said wire-terminating region and others of said conductor wires alternate with said ones and comprise ground wires to be terminated to respective ground pads in said wire-terminating region, said signal wires comprise alternating first and second signal wires, said first signal wires are associated with terminals of a row aligned with said first major surface of said substrate, and said second signal wires are associated with terminals of a second row aligned with said second major surface, wherein said substrate includes first signal paths extending along said first major surface from first ones of said wire-terminating pads to first ones of said terminal-connecting pads, and said substrate includes second signal paths including segments extending along said first major surface from second ones of said wire-terminating pads to plated through-holes and further segments extending along said second major surface from said plated through-holes to second ones of said terminal-connecting pads.

10. A transition adapter as set forth in claim 9 wherein said substrate includes ground circuit path segments extending from ground ones of said wire-terminating pads to a ground bus means, and further includes at least one ground circuit path extending from said ground bus means to a ground one of said terminal-connecting pads.

11. A transition adapter as set forth in claim 10 wherein said ground bus means includes a first portion disposed on said first major surface isolated from stripped conductor portions upon cable assembly, said first portion being connected to said ground circuit path segments, and a second portion disposed on said second major surface connected to said at least one ground circuit path extending to said ground one of said terminal-connecting pads, said first and second ground bus portions interconnected by plated through-holes.

* * * * *